United States Patent [19]
Park

[11] Patent Number: 6,078,544
[45] Date of Patent: Jun. 20, 2000

[54] MULTI-PORT SRAM

[75] Inventor: Yeon Jun Park, Choongcheongbuk-Do, Rep. of Korea

[73] Assignee: LG Semicon Co., Ltd., Choongcheongbuk-Do, Rep. of Korea

[21] Appl. No.: 09/421,233

[22] Filed: Oct. 20, 1999

Related U.S. Application Data

[63] Continuation of application No. 09/166,527, Oct. 6, 1998, abandoned.

[30] Foreign Application Priority Data

Dec. 27, 1997 [KR] Rep. of Korea .................. 75449/1997

[51] Int. Cl.⁷ ...................................................... G11C 8/00

[52] U.S. Cl. ................ 365/230.05; 365/154; 365/189.05

[58] Field of Search ......................... 365/230.05, 189.05, 365/154, 189.04, 230.06

[56] References Cited

U.S. PATENT DOCUMENTS

| | | | |
|---|---|---|---|
| 5,473,574 | 12/1995 | Clemen et al. | 365/230.05 |
| 5,561,638 | 10/1996 | Gibson et al. | 365/230.05 |
| 5,642,325 | 6/1997 | Ang | 365/230.05 |
| 5,644,547 | 7/1997 | Grishakov et al. | 365/230.05 |
| 5,696,935 | 12/1997 | Grochowski et al. | 395/452 |
| 5,717,638 | 2/1998 | Kim | 365/230.05 |
| 5,812,469 | 9/1998 | Nadeau-Dostie et al. | 365/230.05 |

*Primary Examiner*—Son T. Dinh
*Attorney, Agent, or Firm*—Morgan, Lewis & Bockius LLP

[57] ABSTRACT

A multi-port SRAM includes a data latch unit for latching an external data signal in accordance with a write signal from a write word line driver; a driving unit for transmitting a data signal from the data latch unit; a plurality of ports commonly connected to the driving unit for receiving the data signal and for outputting data to a plurality of read bit lines and a plurality of read bit bar lines, respectively, in accordance with a plurality of signals from a read word line driver, respectively; and a control unit for controlling an operation of the driving unit in accordance with the plurality of signals from the read word line driver.

15 Claims, 4 Drawing Sheets

FIG.1
BACKGROUND ART

FIG.2A BACKGROUND ART WWDDR
FIG.2B BACKGROUND ART WBL
FIG.2C BACKGROUND ART WBBL
FIG.2D BACKGROUND ART NodeA
FIG.2E BACKGROUND ART NodeB FIG.3A BACKGROUND ART RWDDR0
FIG.3B BACKGROUND ART NodeA
FIG.3C BACKGROUND ART NodeB
FIG.3D BACKGROUND ART NodeC
FIG.3E BACKGROUND ART NodeD
FIG.3F BACKGROUND ART RBL0
FIG.3G BACKGROUND ART RBBL0

FIG.4

MULTI-PORT SRAM

This application is a continuation-in-part of prior application Ser. No. 09/166,527 filed Oct. 6, 1998, now abandoned which is hereby incorporated by reference. This application claims the benefit of Korean application no. 75449/1997 filed on Dec. 27, 1997, which is hereby incorporated by reference.

BACKGROUND OF THE INVENTION

1. Field of the Invention

The present invention relates to a multi-port static random access memory (SRAM), and in particular to an improved multi-port SRAM with reduced number of transistors and increased read access speed.

2. Discussion of the Related Art

Figure 1:
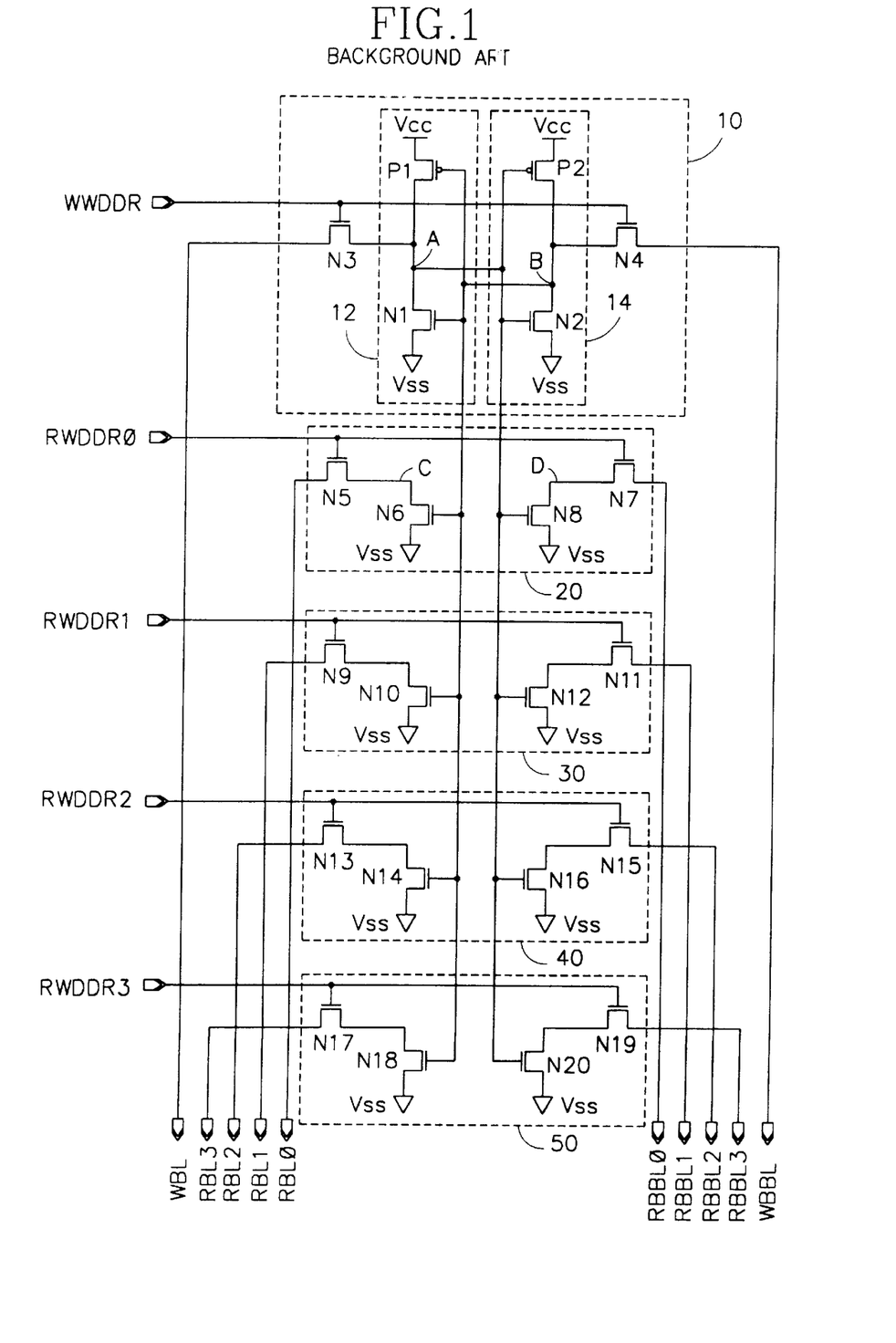
FIG. 1 is a circuit diagram illustrating a conventional multi-port SRAM.

As shown in FIG. 1, a conventional multi-port SRAM includes a data latch unit 10 for latching a data in accordance with an output signal WWDDR from a write word line driver (not shown). In addition, a first port 20 outputs a data from the latch unit 10 to a first read bit line RBL0 and a first read bit bar line RBBL0, respectively, in accordance with a first output signal RWDDR0 from a read word line driver (not shown). A second port 30 outputs a data from the latch unit 10 to a second read bit line RBL1 and a second read bit bar line RBBL1, respectively, in accordance with a second output signal RWDDR1 from the read word line driver (not shown). A third port 40 outputs a data from the latch unit 10 to a third read bit line RBL2 and a third read bit bar line RBBL2, respectively, in accordance with a third output signal RWDDR2 from the read word line driver (not shown). A fourth port 50 outputs a data from the latch unit 10 to a fourth read bit bar line RBL3 and a forth read bit bar line RBBL3, respectively, in accordance with a fourth output signal RWDDR3 from the read word line driver (not shown).

The data latch unit 10 includes a first CMOS inverter 12 and a second CMOS inverter 14. The first CMOS inverter 12 has a first PMOS transistor P1 with its source connected to an electric power Vcc, and a first NMOS transistor N1 with its drain connected to the drain of the first PMOS transistor P1 and its source connected to a ground voltage Vss. The second CMOS inverter 14 has a second PMOS transistor P2 with its source connected to the electric power Vcc, and a second NMOS transistor N2 with its drain connected to the drain of the second PMOS transistor P2 and its source connected to the ground voltage Vss.

The data latch unit 10 also includes a third NMOS transistor N3 and a fourth NMOS transistor N4. The third NMOS transistor N3 has its gate connected to an output signal WWDDR from the write word line driver, its source connected to an output signal from the first CMOS inverter 12, and its drain connected to a write bit line WBL. The fourth NMOS transistor N4 has its gate connected to an output signal WWDDR from the write word line driver (not shown), its source connected to an output signal from the second CMOS inverter 14, and its drain connected to the write bit bar line WBBL.

At this time, the third NMOS transistor N3 and the fourth NMOS transistor N4 are write access transistors. The output signal from the first CMOS inverter 12 is applied to the input terminal of the second CMOS inverter 14, and the output signal from the second CMOS inverter 14 is applied to the input terminal of the first CMOS inverter 12, thereby performing a latching operation.

The first port 20 includes a fifth NMOS transistor N5, a sixth NMOS transistor N6, a seventh NMOS transistor N7, and a eighth NMOS transistor N8. The fifth NMOS transistor N5 has its gate connected to a first output signal RWDDR0 and its drain connected to the first read bit line RBL0. The sixth NMOS transistor N6 has its drain connected to the drain of the fifth NMOS transistor N5, its source connected to the ground voltage Vss, and its gate connected to an output signal from the second CMOS inverter 14. The seventh NMOS transistor N7 has its gate connected to the first output signal RWDDR0 from the read word line driver and its drain connected to the first read bit bar line RBBL0. The eighth NMOS transistor N8 has its drain connected to the drain of the seventh NMOS transistor N7, its source connected to the ground voltage Vss, and its gate connected to an output signal from the first CMOS inverter 12.

The second port 30 includes a ninth NMOS transistor N9, a tenth NMOS transistor N10, an eleventh NMOS transistor N11, and a twelfth NMOS transistor N12. The ninth NMOS transistor N9 has its gate connected to a second output signal RWDDR1 from the read word line driver (not shown) and its drain connected to the second read bit line RBL1. The tenth NMOS transistor N10 has its drain connected to the ninth NMOS transistor N9, its source connected to the ground voltage Vss, and its gate connected to the output signal from the second CMOS inverter 14. The eleventh NMOS transistor N11 has its gate connected to the second output signal RWDDR1 from the read word line driver and its drain connected to the second read bit bar line RBBL1. The twelfth NMOS transistor N12 has its drain connected to the drain of the eleventh NMOS transistor N11 and its gate connected to the output signal from the first CMOS inverter 12.

The third port 40 includes a thirteenth NMOS transistor N13, a fourteenth NMOS transistor N14, a fifteenth NMOS transistor N15, and a sixteenth NMOS transistor N16. The thirteenth NMOS transistor 13 has its gate connected to a third output signal RWDDR2 from the read word line driver and its drain connected to the third read bit line RBL2. The fourteenth NMOS transistor N14 has its drain connected to the drain of the thirteenth NMOS transistor N13, its source connected to the ground voltage Vss, and its gate connected to the output signal from the second CMOS inverter 14. The fifteenth NMOS transistor N15 has its gate connected to the third output signal RWDDR2 from the read word line driver and its drain connected to the third read bit bar line. The sixteenth NMOS transistor N16 has its drain connected to the drain of the fifteenth NMOS transistor N15, its source connected to the ground voltage Vss, and its gate connected to the output signal from the first CMOS inverter 12.

The fourth port 50 includes a seventeenth NMOS transistor N17, an eighteenth NMOS transistor N18, a nineteenth NMOS transistor N19, and a twentieth NMOS transistor N20. The seventeenth NMOS transistor N17 has its gate connected to a fourth output signal RWDDR3 from the read word line driver and its drain connected to a fourth read bit line RBL3. The eighteenth NMOS transistor N18 has its drain connected to the drain of the seventeenth NMOS transistor N17, its source connected to the ground voltage Vss, and its gate connected to the output signal from the second CMOS inverter 14. The nineteenth NMOS transistor N19 has its gate connected to the fourth output signal RWDDR3 from the read word line driver and its drain connected to the fourth read bit bar line RBBL3. The twentieth NMOS transistor N20 has its drain connected to the drain of the nineteenth NMOS transistor N19, its source connected to the ground voltage Vss, and its gate connected to the output signal from the first CMOS inverter 12.

At this time, the fifth, seventh, ninth, eleventh, thirteenth, fifteenth, seventeenth and nineteenth NMOS transistors N5, N7, N9, N11, N13, N15, N17 and N19 each performs a read access function, and the sixth, eighth, tenth, twelfth, fourteenth, sixteenth, eighteenth and twentieth NMOS transistors N6, N8, N10, N12, N14, N16, N18 and N20 act as driver transistors for driving the read access transistors.

The operation of the conventional multi-port SRAM will now be explained with reference to the accompanying drawings.

First, in the write mode, when an output signal WWDDR from the write word line driver (not shown) is a high level, the third and fourth NMOS transistors N3 and N4 are turned on, and the data inputted through the write bit line WBL and the write bit bar line WBBL are inputted into the output terminals of the first and second CMOS inverters 12 and 14.

Figure 2A:
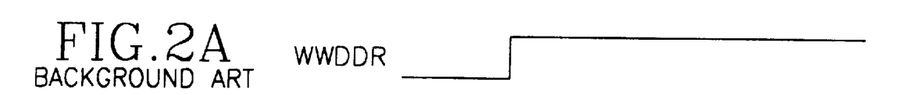
FIGS. 2A through 2E are wave form diagrams illustrating signals of each element in the write mode of the circuit of FIG. 1.
Figure 2B:
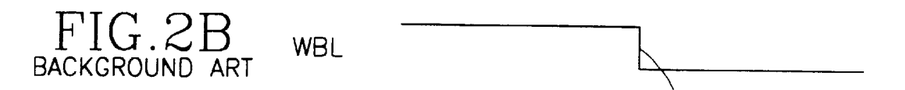
Figure 2C:
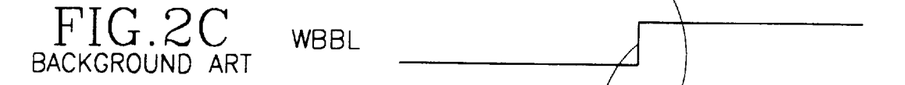
Figure 2D:
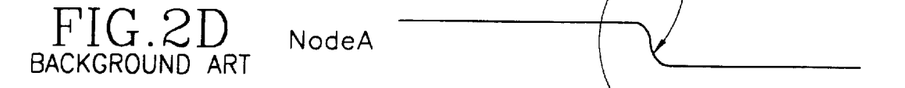
Figure 2E:
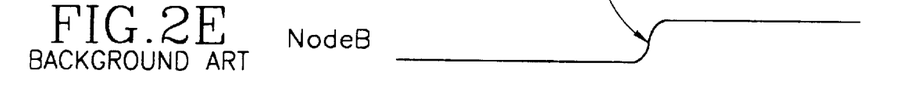

In other words, as shown in FIGS. 2B and 2C, when the data signal inputted through the write bit line WBL is changed from a high level to a low level, and the data signal inputted through the write bit bar line WBBL is changed from a low level to a high level, as shown in FIGS. 2D and 2E, the data signals outputted to the output terminals of the first and second CMOS inverters 12 and 14 are changed from the high level to the lower level and from the low level to the high level, respectively. In addition, the first and second CMOS inverters 12 and 14 perform a latching function, and the voltage levels of the output terminals remain a low level and a high level, respectively.

In addition, the read mode is enabled when the output signals RWDDR0 through RWDDR3 from the read word line driver (not shown) maintain a high level, respectively.

Figure 3A:
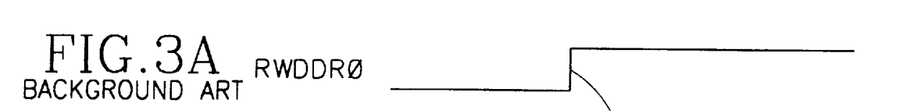
FIGS. 3A through 3G are wave form diagrams illustrating signals of each element in the read mode of the circuit of FIG.
Figure 3B:
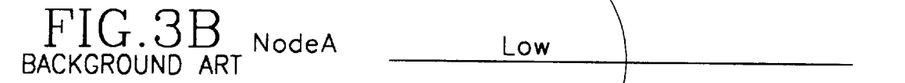
Figure 3C:
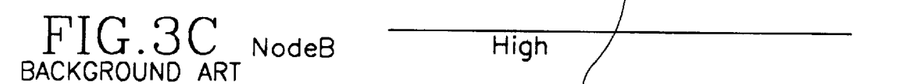

As shown in FIG. 3A, when a first output signal RWDDR0 from the read word line driver (not shown) is inputted as a high level signal, the first port 20 performs the reading operation. In addition, the output terminals (first and second nodes A and B) of the first and second CMOS inverters 12 and 14 maintain a low level and a high level, respectively. Also, the sixth NMOS transistor N6 of the first port 20 is turned on, and the eighth NMOS transistor N8 is turned off.

Figure 3D:
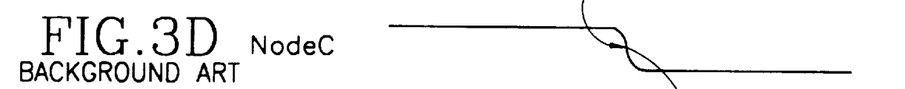
Figure 3E:
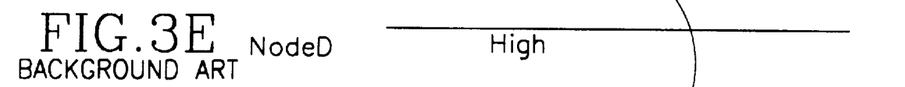

As shown in FIGS. 3D and 3E, the third node C becomes a low level due to the output signals from the sixth NMOS transistor N6 and the eighth NMOS transistor N8, and the fourth node D maintains a high level.

Figure 3F:
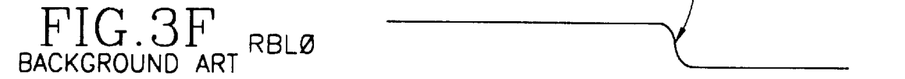
Figure 3G:
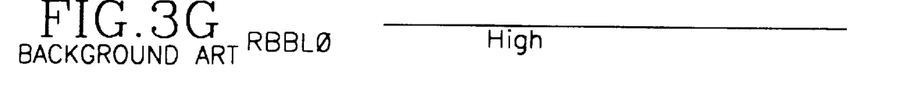

The signals from the third node C and the fourth node D are applied to the first read bit line RBL0 and the first read bit bar line RBBL0 through the fifth NMOS transistor N5 and the seventh NMOS transistor N7 as shown in FIGS. 3F and 3G.

The operations of the second port 30, the third port 40, and the fourth port 50 are similar to that of the first port 20 in accordance with the second through fourth output signals RWDDR1 through RWDDR3 from the read word line driver (not shown).

However, in the conventional multi-port SRAM, in the read mode, since each access transistor is provided with a driver transistor, the surface of the memory cell is increased. Also, because it is impossible to increase the size of the driver transistor, the data reading access speed is limited.

SUMMARY OF THE INVENTION

Accordingly, the present invention is directed to a multi-port SRAM that substantially obviates one or more of the problems due to limitations and disadvantages of the related art.

An object of the present invention is to provide a multi-port SRAM with reduced number of transistors and increased read access speed by increasing the size of a common driver transistor and by commonly using a driver transistor for each read memory port.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a multi-port SRAM of the present invention includes a data latch unit for latching an externally inputted data signal in accordance with an output signal from an externally connected write word line driver, a driving unit for transmitting a data signal from the data latch unit, a first port for outputting a data signal inputted through the driving unit to a first read bit line and a first read bit bar line, respectively, in accordance with a first output signal from the externally connected read word line driver, a second port for outputting a data signal inputted through the driving unit to a second read bit line and a second read bit bar line, respectively, in accordance with a second output signal from the externally connected read word line driver, a third port for outputting a data signal inputted through the driving unit to a third read bit line and a third read bit bar line, respectively, in accordance with a third output signal from the externally connected word line driver, and a fourth port for outputting a data signal inputted through the driving unit to a fourth read bit line and a fourth read bit bar line, respectively, in accordance with a fourth output signal from the externally connected read word line driver.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention.

In the drawings.

DETAILED DESCRIPTION OF THE PREFERRED EMBODIMENTS

The construction and operation of the multi-port SRAM according to the present invention will now be explained with reference to the accompanying drawings.

Figure 4:
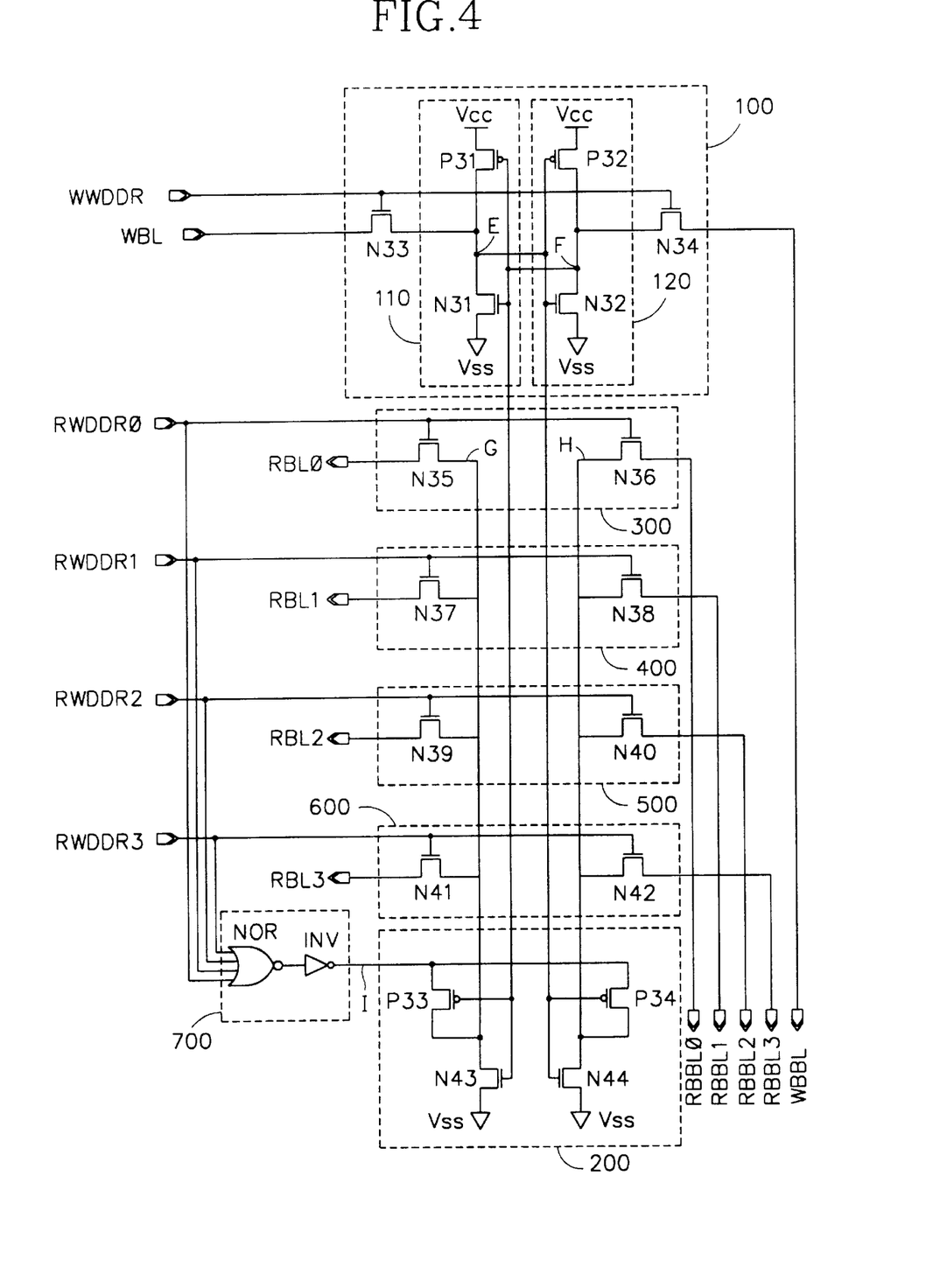
FIG. 4 is a circuit diagram illustrating a multi-port SRAM according to the present invention.

As shown in FIG. 4, the multi-port SRAM according to the present invention includes a data latch unit 100 for latching a data signal in accordance with an output signal WWDDR from a write word line driver (not shown), a driving unit 200 for transmitting a data signal from the data latch unit 100 to each port, and a control unit 700 for controlling the operation of the driving unit 200.

The multi-port SRAM also includes a first port 300, a second port 400, a third port 500, and a fourth port 600. The first port 300 outputs a data signal from the driving unit 200 to a first read bit line RBL0 and a first read bit bar line RBBL0, respectively, in accordance with a first output signal RWDDR0 from a read word line driver (not shown). The second port 400 outputs a data signal from the driving unit 200 to a second read bit line RBL1 and a second read bit bar line RBBL1, respectively, in accordance with a second output signal RWDDR1 from the read word line driver (not shown). The third port 500 outputs a data signal from the driving unit 200 to a third read bit line RBL2 and a third read bit bar line RBBL2, respectively, in accordance with a third output signal RWDDR2 from the read word line driver (not shown). The fourth port 600 outputs a data signal from the driving unit 200 to a fourth read bit line RBL3 and a fourth read bit bar line RBBL3, respectively, in accordance with a fourth output signal RWDDR3 from the read word line driver (not shown).

The data latch unit 100 includes a first CMOS inverter 110 and a second CMOS inverter 120. The first CMOS inverter 110 has a first PMOS transistor P31 with its source connected to an electric power Vcc, and a first NMOS transistor N31 with its drain connected to the drain of the first PMOS transistor P31 and its source connected to a ground voltage Vss. The second CMOS inverter 120 has a second PMOS transistor P32 with its source connected to the electric power Vcc, and a second NMOS transistor N32 with its drain connected to the drain of the second PMOS transistor P32 and its source connected to the ground voltage Vss.

The data latch unit 100 also includes a third NMOS transistor N33 and a fourth NMOS transistor N34. The third NMOS transistor N33 has its gate connected to an output signal WWDDR from the write word line driver (not shown), its source connected to an output signal from the first CMOS inverter 110, and its drain connected to the write bit line WBL. The fourth NMOS transistor N34 has its gate connected to the output signal WWDDR from the write word line driver (not shown), its source connected to an output signal from the second CMOS inverter 120, and its drain connected to the write bit bar line WBBL.

Here, the third NMOS transistor N33 and the fourth NMOS transistor N34 are write access transistors. The output signal from the first CMOS inverter 110 is inputted into the input terminal of the second CMOS inverter 120, and the output signal from the second CMOS inverter 120 is applied to the input terminal of the first CMOS inverter 110, thereby performing a latching operation.

The first port 300 includes a fifth NMOS transistor N35 and a sixth NMOS transistor N36. The fifth NMOS transistor N35 has its gate connected to a first output signal RWDDR0 from the read word line driver (not shown) and its drain connected to the first read bit line RBL0. The sixth NMOS transistor N36 has its gate connected to the first output signal RWDDR0 from the read word line driver (not shown) and its drain connected to the first read bit bar line RBBL0.

The second port 400 includes a seventh NMOS transistor N37 and an eighth NMOS transistor N38. The seventh NMOS transistor N37 has its gate connected to a second output signal RWDDR1 from the read word line driver (not shown) and its drain connected to the second read bit line RBL1. The eighth NMOS transistor N38 has its gate connected to the second output signal RWDDR1 from the read word line driver (not shown) and its drain connected to the second read bit bar line RBBL1.

The third port 500 includes a ninth NMOS transistor N39 and a tenth NMOS transistor N40. The ninth NMOS transistor N39 has its gate connected to a third output signal RWDDR2 from the read word line driver (not shown) and its drain connected to the third read bit line RBL2. The tenth NMOS transistor N40 has its gate connected to a third output signal RWDDR2 from the read word line driver (not shown) and its drain connected to the third read bit bar line RBBL2.

The fourth port 600 includes an eleventh NMOS transistor N41 and a twelfth NMOS transistor N42. The eleventh NMOS transistor N41 has its gate connected to a fourth output signal RWDDR3 from the read word line driver (not shown) and its drain connected to the fourth read bit line RBL3. The twelfth NMOS transistor N42 has its gate connected to the fourth output signal RWDDR3 from the read word line driver and its drain connected to the fourth read bit bar line RBBL3.

The driving unit 200 includes a thirteenth NMOS transistor N43, a fourteenth NMOS transistor N44, and PMOS transistors P33 and P34. The thirteenth NMOS transistor N43 has its source connected to the ground voltage Vss, its gate connected to the output signal from the second CMOS inverter 120, and its drain commonly connected with the drains of the fifth, seventh, ninth and eleventh NMOS transistors N35, N37, N39 and N41 of the ports 300 through 600, respectively. The fourteenth NMOS transistor N44 has its source connected to the ground voltage Vss, its gate connected to the output signal from the first CMOS inverter 110, and its drain commonly connected with the drains of the sixth, eighth, tenth and twelfth NMOS transistors N36, N38, N40 and N42 of the ports 300 through 600, respectively.

In addition, sources of the PMOS transistors P33, P34 are connected to an output from the control unit 700, and drains thereof are connected to the NMOS transistors N43, N44, respectively. Also, gates of the PMOS transistors P33, P34 are connected to nodes E, F in order to charge read bit lines RBL0~3 and read bit bar lines RBBL0~3.

Sources of the NMOS transistors N43, N44 in the driving unit 200 are applied to the ground voltage VSS, gates thereof are connected to the nodes E, F, and drains thereof are commonly connected to the drains of the PMOS transistors P33, P34 and the NMOS transistors of each port 300~600.

The control unit 700 includes a NOR gate NOR and an inverter INV.

The operation of the multi-port SRAM according to the present invention will now be explained with reference to FIGS. 4 and 5A through 5F.

First, in the write mode, when the output signal WWDDR from the write word line driver (not shown) is at a high level, the third and fourth NMOS transistors N33 and N34 are turned on, and the data signals inputted through the write bit line WBL and the write bit bar line WBBL are inputted into the output terminals of the first and second CMOS inverters 110 and 120 of the data latch unit 100. As a result, the inputted data signals are latched.

The read mode is performed when the output signals RWDDR0 through RWDDR3 from the read word line driver (not shown) are at high levels.

Figure 5A:
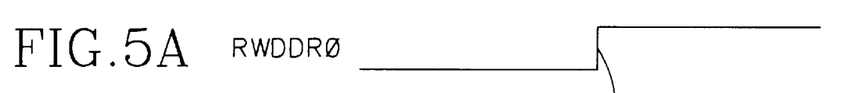
FIGS. 5A through 5F are wave form diagrams illustrating signals of different nodes in the read mode of the circuit of FIG. 4.
Figure 5B:
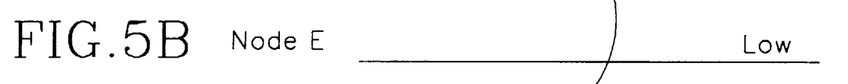
Figure 5C:
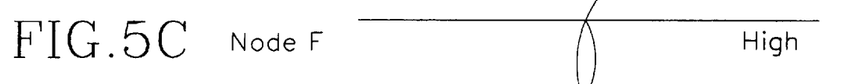
Figure 5D:
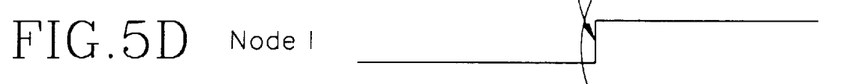
Figure 5E:
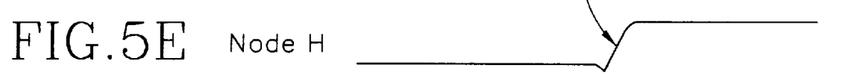
Figure 5F:
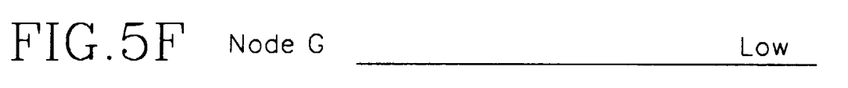

As shown in FIG. 5A, when a first output signal RWDDR0 of a read word line driver (not shown) is inputted at a high level, a first port 300 in FIG. 4 performs a read operation. Here, in case the output terminals (first and second nodes E, F) of the first and second CMOS inverters 110, 120 have data signals at a low level (FIG. 5B) and a high level (FIG. 5c), respectively, the PMOS transistor P33 is turned off, the PMOS transistor P34 is turned on, the NMOS transistor N43 is turned on and the NMOS transistor N44 is turned off. At this time, the NOR gate of the control unit 700 NORs an output signal RWDDR from the read word line driver (not shown), and outputs it to the inverter INV. When at least one of the output signals RWDDR from the read word line driver is at a high level in the control unit 700, an output signal from the control unit 700 becomes a high level, and thus a node I becomes a high level as shown in FIG. 5D.

Here, the high- and low- level data signals latched by the output terminals E, F of the latch unit 100 are applied to the gates of the PMOS transistors P33, P34 and the NMOS transistors N43, N44, and thus the PMOS transistor P33 and the NMOS transistor N44 are turned off, and the PMOS transistor P34 and the NMOS transistor N43 are turned on. As a result, a node H is precharged with a voltage of the node I through the turned-on PMOS transistor P34, and a node G is discharged to a ground level through the turned-on NMOS transistor N43. Thereafter, the signals of the node G(FIG. 5F) and the node H(FIG. 5E) are transmitted to the first read bit line RBL0 and the first read bit bar line RBBL0 through NMOS transistors N35, N36 which are read access transistors, and externally outputted.

The second port 400 through the fourth port 600 perform the read mode similarly as the operation of the first port 300 in accordance with the second through fourth output signals RWDDR1 through RWDDR3 from the read word line driver (not shown).

Therefore, in the write mode, the circuit is operated identically to the conventional art. However, in the read mode, one driving unit 200 is commonly connected to the first through fourth ports 300 through 600 for transmitting a data signal, and the first through fourth ports 300 through 600 output data to the outside in accordance with the output signals RWDDR0 through RWDDR3 from the read word line driver (not shown). Also, a fast access time is obtained by carrying out the above-described operation.

As described above, in the present invention, it is possible to reduce the surface size of a memory cell by reducing the number of transistors, i.e., by commonly using one driver transistor. In addition, by increasing the size of the driver transistor, a faster data access speed can be achieved.

It will be apparent to those skilled in the art that various modifications and variations can be made in the multi-port SRAM of the present invention without departing from the spirit or scope of the invention. Thus, it is intended that the present invention covers the modifications and variations of this invention provided they come within the scope of the appended claims and their equivalents.

What is claimed is:

1. A multi-port SRAM, comprising:
   a data latch unit for latching an externally inputted data signal in accordance with a write signal from a write word line driver;
   a driving unit for transmitting a data signal from the data latch unit;
   a first port for outputting a first data signal inputted through the driving unit to a first read bit line and a first read bit bar line, respectively, in accordance with a first output signal from a read word line driver;
   a second port for outputting a second data signal inputted through the driving unit to a second read bit line and a second read bit bar line, respectively, in accordance with a second output signal from the read word line driver;
   a third port for outputting a third data signal inputted through the driving unit to a third read bit line and a third read bit bar line, respectively, in accordance with a third output signal from the read word line driver;
   a fourth port for outputting a fourth data signal inputted through the driving unit to a fourth read bit line and a fourth read bit bar line, respectively, in accordance with a fourth output signal from the read word line driver; and
   a control unit for controlling an operation of the driving unit in accordance with the first through fourth output signals from the read word line driver.

2. The multi-port SRAM of claim 1, wherein the data latch unit includes:
   a first CMOS inverter having a first PMOS transistor and a first NMOS transistor, the first PMOS transistor having a drain and a source, the first NMOS transistor having a drain and a source, the source of the first PMOS transistor being connected to an electric power, the drain of the first PMOS transistor being connected to the drain of the first NMOS transistor, and the source of the first NMOS transistor being connected to a ground voltage;
   a second CMOS inverter having a second PMOS transistor and a second NMOS transistor, the second PMOS transistor having a drain and a source, the second NMOS transistor having a drain and a source, the source of the second PMOS transistor being connected to the electric power, the drain of the second PMOS transistor being connected to the drain of the second NMOS transistor, and the source of the second NMOS transistor being connected to the ground voltage;
   a third NMOS transistor having a gate, a source, and a drain, the gate of the third NMOS transistor receiving the write signal from the write word line driver, the source of the third NMOS transistor being connected to an output signal from the first CMOS inverter, and the drain of the third NMOS transistor being connected to a write bit line; and
   a fourth NMOS transistor having a gate, a source, and a drain, the gate of the fourth NMOS transistor being connected to the write signal from the write word line driver, the source of the fourth NMOS transistor being connected to an output signal from the second CMOS inverter, and the drain of the fourth NMOS transistor being connected to a write bit bar line,
   wherein an output terminal of the first CMOS inverter is connected with an input terminal of the second CMOS inverter, and an input terminal of the first CMOS inverter is connected with an output terminal of the second CMOS inverter.

3. The multi-port SRAM of claim 1, wherein the first port includes:
   a fifth NMOS transistor having a gate and a drain, the gate of the fifth NMOS transistor receiving the first output signal from the read word line driver, and the drain of the fifth NMOS transistor being connected to the first read bit line; and
   a sixth NMOS transistor having a gate and a drain, the gate of the sixth NMOS transistor receiving the first output signal from the read word line driver, and the drain of the sixth NMOS transistor being connected to the first read bit bar line.

4. The multi-port SRAM of claim 1, wherein the second port includes:
   a seventh NMOS transistor having a gate and a drain, the gate of the seventh NMOS transistor receiving the second output signal from the read word line driver, and the drain of the seventh NMOS transistor being connected to the second read bit line; and
   an eighth NMOS transistor having a gate and a drain, the gate of the eighth NMOS transistor receiving the second output signal from the read word line driver, and the drain of the eighth NMOS transistor being connected to the second read bit bar line.

5. The multi-port SRAM of claim 1, wherein the third port includes:
   a ninth NMOS transistor having a gate and a drain, the gate of the ninth NMOS transistor receiving the third output signal from the read word line driver, and the drain of the ninth NMOS transistor being connected to the third read bit line; and
   a tenth NMOS transistor having a gate and a drain, the gate of the tenth NMOS transistor receiving the third output signal from the read word line driver, and the drain of the tenth NMOS transistor being connected to the third read bit bar line.

6. The multi-port SRAM of claim 1, wherein the fourth port includes:
   an eleventh NMOS transistor having a gate and a drain, the gate of the eleventh NMOS transistor receiving the fourth output signal from the read word line driver, and the drain of the eleventh NMOS transistor being connected to the fourth read bit line; and
   a twelfth NMOS transistor having a gate and a drain, the gate of the twelfth NMOS transistor receiving the fourth output signal from the read word line driver, and the drain of the twelfth NMOS transistor being connected to the fourth read bit bar line.

7. The multi-port SRAM of claim 2, wherein the driving unit includes:
   a thirteenth NMOS transistor having a source, a gate, and a drain, the source of the thirteenth NMOS transistor being connected to the ground voltage, the gate of the thirteenth NMOS transistor receiving the output signal from the second CMOS inverter, and the drain of the thirteenth NMOS transistor being commonly connected to the first port, the second port, the third port, and the fourth port;
   a fourteenth NMOS transistor having a source, a gate, and a drain, the source of the fourteenth NMOS transistor being connected to the ground voltage, the gate of the fourteenth NMOS transistor receiving the output signal from the first CMOS inverter, and the drain of the fourteenth NMOS transistor being is commonly connected to the first port, the second port, the third port, and the fourth port;
   a third PMOS transistor having a source, a gate, and a drain, the source of the third PMOS transistor being connected to an output from the control unit, the drain of the third PMOS transistor being connected to the drain of the thirteenth NMOS transistor, and the gate of the third PMOS transistor being connected to the gate of the thirteenth NMOS transistor and receiving the output signal from the second CMOS inverter; and
   a fourth PMOS transistor having a source, a gate, and a drain, the source of the fourth PMOS transistor being connected to the output of the control unit, the drain of the fourth PMOS transistor being connected to the drain of the fourteenth NMOS transistor, and the gate of the fourth PMOS transistor being connected to the gate of the fourteenth NMOS transistor and receiving the output signal from the first CMOS inverter.

8. The multi-port SRAM of claim 1, wherein the write word line driver is externally connected to the multi-port SRAM.

9. The multi-port SRAM of claim 1, wherein the read word line driver is externally connected to the multi-port SRAM.

10. The multi-port SRAM of claim 1, wherein the control unit includes a NOR gate connected to an inverter, an output terminal of the inverter being connected to the driving unit.

11. A multi-port SRAM, comprising:
    a data latch unit for latching an external data signal in accordance with a write signal from a write word line driver;
    a driving unit for transmitting a data signal from the data latch unit;
    a plurality of ports commonly connected to the driving unit for receiving the data signal and for outputting data to a plurality of read bit lines and a plurality of read bit bar lines, respectively, in accordance with a plurality of signals from a read word line driver, respectively; and
    a control unit for controlling an operation of the driving unit in accordance with the plurality of signals from the read word line driver.

12. The multi-port SRAM of claim 11, wherein the data latch unit includes:
    a first CMOS inverter having a first PMOS transistor and a first NMOS transistor, the first PMOS transistor having a drain and a source, the first NMOS transistor having a drain and a source, the source of the first PMOS transistor being connected to an electric power, the drain of the first PMOS transistor being connected to the drain of the first NMOS transistor, and the source of the first NMOS transistor being connected to a ground voltage;
    a second CMOS inverter having a second PMOS transistor and a second NMOS transistor, the second PMOS transistor having a drain and a source, the second NMOS transistor having a drain and a source, the source of the second PMOS transistor being connected to the electric power, the drain of the second PMOS transistor being connected to the drain of the second NMOS transistor, and the source of the second NMOS transistor being connected to the ground voltage;
    a third NMOS transistor having a gate, a source, and a drain, the gate of the third NMOS transistor receiving the write signal from the write word line driver, the source of the third NMOS transistor being connected to an output signal from the first CMOS inverter, and the drain of the third NMOS transistor being connected to a write bit line; and
    a fourth NMOS transistor having a gate, a source, and a drain, the gate of the fourth NMOS transistor being connected to the write signal from the write word line driver, the source of the fourth NMOS transistor being connected to an output signal from the second CMOS inverter, and the drain of the fourth NMOS transistor being connected to a write bit bar line,
    wherein an output terminal of the first CMOS inverter is connected with an input terminal of the second CMOS inverter, and an input terminal of the first CMOS inverter is connected with an output terminal of the second CMOS inverter.

13. The multi-port SRAM of claim 11, wherein each of the plurality of ports includes:

a first NMOS transistor having a gate and a drain, the gate of the first NMOS transistor receiving one of the plurality of signals from the read word line driver, and the drain of the first NMOS transistor being connected to one of the plurality of read bit lines; and a second NMOS transistor having a gate and a drain, the gate of the second NMOS transistor receiving said one of the plurality of signals from the read word line driver, and the drain of the second NMOS transistor being connected to one of the plurality of read bit bar lines.

14. The multi-port SRAM of claim 12, wherein the driving unit includes:

a fifth NMOS transistor having a source, gate, and a drain, the source of the fifth NMOS transistor being connected to the ground voltage, the gate of the fifth NMOS transistor receiving the output signal from the second CMOS inverter, and the drain of the fifth NMOS transistor being commonly connected to the plurality of ports;

a sixth NMOS transistor having a source, a gate, and a drain, the source of the sixth NMOS transistor being connected to the ground voltage, the gate of the sixth NMOS transistor receiving the output signal from the first CMOS inverter, and the drain of the sixth NMOS transistor being commonly connected to the plurality of ports;

a third PMOS transistor having a source, a gate, and a drain, the source of the third PMOS transistor being connected to an output from the control unit, the drain of the third PMOS transistor being connected to the drain of the fifth NMOS transistor, and the gate of the third PMOS transistor being connected to the gate of the fifth NMOS transistor and receiving the output signal from the second CMOS inverter; and a fourth PMOS transistor having a source, a gate, and a drain, the source of the fourth PMOS transistor being connected to the output of the control unit, the drain of the fourth PMOS transistor being connected to the drain of the sixth NMOS transistor, and the gate of the fourth PMOS transistor being connected to the gate of the sixth NMOS transistor and receiving the output signal from the first CMOS inverter.

15. The multi-port SRAM of claim 11, wherein the control unit includes a NOR gate connected to an inverter, an output terminal of the inverter being connected to the driving unit.

* * * * *